United States Patent [19]

Blackstone

[11] Patent Number: 5,416,354
[45] Date of Patent: May 16, 1995

[54] INVERTED EPITAXIAL PROCESS SEMICONDUCTOR DEVICES

[75] Inventor: Scott C. Blackstone, Needham, Mass.

[73] Assignee: Unitrode Corporation, Billerica, Mass.

[21] Appl. No.: 176,339

[22] Filed: Jan. 3, 1994

Related U.S. Application Data

[63] Continuation of Ser. No. 963,946, Oct. 20, 1992, abandoned, which is a continuation of Ser. No. 649,125, Jan. 28, 1991, abandoned, which is a continuation of Ser. No. 295,050, Jan. 6, 1989, abandoned.

[51] Int. Cl.$^6$ .......................................... H02L 27/04
[52] U.S. Cl. .................................. 257/499; 257/335; 257/502; 257/506; 257/344
[58] Field of Search .................. 357/43, 46, 56, 92, 357/49; 437/62, 61, 225, 235, 243, 946; 257/499, 500, 501, 502, 506, 522, 335–336, 339, 341, 344, 508

[56] References Cited

U.S. PATENT DOCUMENTS

| | | | |
|---|---|---|---|
| 3,116,443 | 12/1963 | Forster et al. | 357/56 |
| 3,375,418 | 3/1968 | Garnache et al. | 317/235 |
| 3,423,255 | 1/1969 | Joyce | 148/175 |
| 3,440,498 | 4/1969 | Mitchell | 357/46 |
| 3,624,463 | 11/1971 | Davidsohn | 317/234 |
| 3,769,561 | 10/1973 | White et al. | 357/43 |
| 3,911,474 | 10/1975 | Rosvold | 357/71 |
| 3,950,233 | 4/1976 | Rosvold | 204/15 |
| 4,139,401 | 2/1979 | McWilliams et al. | 148/175 |
| 4,232,328 | 11/1980 | Hartman et al. | 357/49 |
| 4,238,278 | 12/1980 | Antipov | 156/657 |
| 4,286,280 | 8/1981 | Sugawara | 357/49 |
| 4,376,286 | 3/1983 | Lidow et al. | 257/342 |
| 4,402,128 | 9/1983 | Blackstone | 29/591 |
| 4,468,683 | 8/1984 | Dahlberg | 357/23.1 |
| 4,526,665 | 7/1985 | Taniellian et al. | 204/192 C |
| 4,543,595 | 9/1985 | Vora | 357/92 |
| 4,544,576 | 10/1985 | Chu et al. | 427/82 |
| 4,546,375 | 10/1985 | Blackstone et al. | 357/23.4 |
| 4,546,538 | 10/1985 | Suzuki | 29/576 W |
| 4,549,926 | 10/1985 | Corboy, Jr. et al. | 156/612 |
| 4,578,142 | 3/1986 | Corboy, Jr. et al. | 156/612 |

(List continued on next page.)

FOREIGN PATENT DOCUMENTS

| | | | |
|---|---|---|---|
| 0256397 | 2/1988 | European Pat. Off. | |
| 2460653 | 7/1975 | Germany | 257/506 |
| 55-113372 | 9/1980 | Japan | 357/92 |
| 0172346 | 8/1986 | Japan | 257/522 |
| 63-34949 | 2/1988 | Japan | |

OTHER PUBLICATIONS

*IBMTDB*, "Silicon-on-Insulator Vertical Complementary Bipolar Device Structures", vol. 34, No. 4A, Sep. 1991, pp. 166–170.

Baliga, Jayant B., Fellow, IEEE: Analysis of a High-Voltage Merged p-in-n/Schottky (MPS) Rectifier; Corporate Research and Development, General Electric Company, Schenectdy, N.Y. 12301, IEEE Log No.-8715453.

Hashimoto, Norikazu; Koga, Yashushi: The Si-WSi$_2$-Si Epitaxial Structure; Journal Electrochemical Society, vol. 114, No. 11, Nov., 1967, pp. 1189–1191.

Ishiwara, et al.: Laser and Electron-Beam Solid Interactions & Materials Processing (Gibbons, J. F. edited); Materials Research Society Symposia Proceedings, 1981, pp. 525–531.

Saitoh, et al.: Double heteroepitaxy in the Si (111) CoSi$_2$Si Structure; Appl. Phys. Lett., 37(2), 15 Jul. 1980, pp. 203–205.

*Primary Examiner*—J. Carroll
*Attorney, Agent, or Firm*—Weingarten, Schurgin, Gagnebin & Hayes

[57] ABSTRACT

A semiconductor device is disclosed having improved vertical gain symmetry, and which includes thick, lightly-doped regions which are dielectrically isolated and provided by at least two separately processed semiconductor wafers which are bonded together and further processed to provide the finished device. Alternate embodiments include buried layers exhibiting very low resistance. Further alternate embodiments provide high voltage and/or high current devices which are fabricated together with low-power circuitry as an integrated circuit.

7 Claims, 13 Drawing Sheets

U.S. PATENT DOCUMENTS

| Patent # | Date | Inventor | Class |
|---|---|---|---|
| 4,582,559 | 4/1986 | Tanielian et al. | 156/603 |
| 4,584,594 | 4/1986 | Vora et al. | 357/92 |
| 4,586,240 | 5/1986 | Blackstone et al. | 29/571 |
| 4,638,552 | 1/1987 | Shimbo et al. | 29/576 J |
| 4,649,627 | 3/1987 | Abernathey et al. | 29/571 |
| 4,653,177 | 3/1987 | Lebowitz et al. | 29/578 |
| 4,671,846 | 6/1987 | Shimbo et al. | 156/629 |
| 4,700,466 | 10/1987 | Nakagawa et al. | 437/247 |
| 4,707,197 | 11/1987 | Hensel et al. | 437/189 |
| 4,710,794 | 12/1987 | Koshino et al. | 257/526 |
| 4,717,681 | 1/1988 | Curran | 437/31 |
| 4,728,626 | 3/1988 | Tu | 437/126 |
| 4,738,935 | 4/1988 | Shimbo et al. | 437/31 |
| 4,758,534 | 7/1988 | Derkits, Jr. et al. | 437/89 |
| 4,784,970 | 11/1988 | Solomon | 437/51 |
| 4,791,073 | 12/1988 | Nagy et al. | 437/67 |
| 4,791,465 | 12/1988 | Sakai et al. | 357/25 |
| 4,851,366 | 7/1989 | Blanchard | 437/61 |
| 4,855,804 | 8/1989 | Bergami et al. | 357/49 |
| 4,871,689 | 10/1989 | Bergami et al. | 437/67 |
| 4,873,205 | 10/1989 | Critchlow et al. | 437/200 |
| 4,876,217 | 10/1989 | Zdebel | 437/67 |
| 4,879,584 | 11/1989 | Takagi et al. | 357/43 |
| 4,888,300 | 12/1989 | Burton | 437/61 |
| 4,963,505 | 10/1990 | Fujii et al. | 437/62 |
| 4,985,745 | 1/1991 | Kitahara et al. | 357/49 |
| 5,004,705 | 4/1991 | Blackstone | 437/225 |
| 5,057,895 | 10/1991 | Beasom | 357/49 |
| 5,094,972 | 3/1992 | Pierce et al. | 437/67 |
| 5,098,856 | 3/1992 | Beyer et al. | 437/65 |
| 5,126,817 | 6/1992 | Baba et al. | 357/49 |

EMITTER INJECTION

COLLECTOR INJECTION

EMITTER INJECTION

COLLECTOR INJECTION

EPI BASE TRANSISTOR

DOUBLE DIFFUSED TRANSISTOR

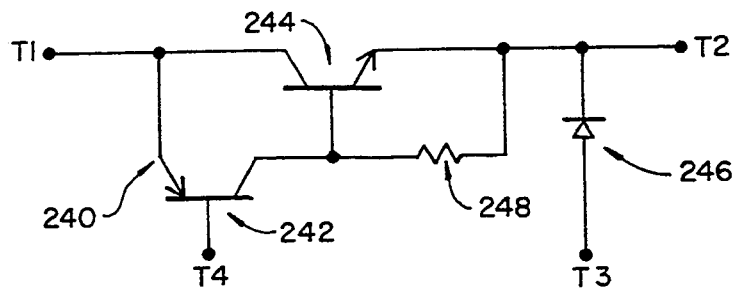
FIG. 10
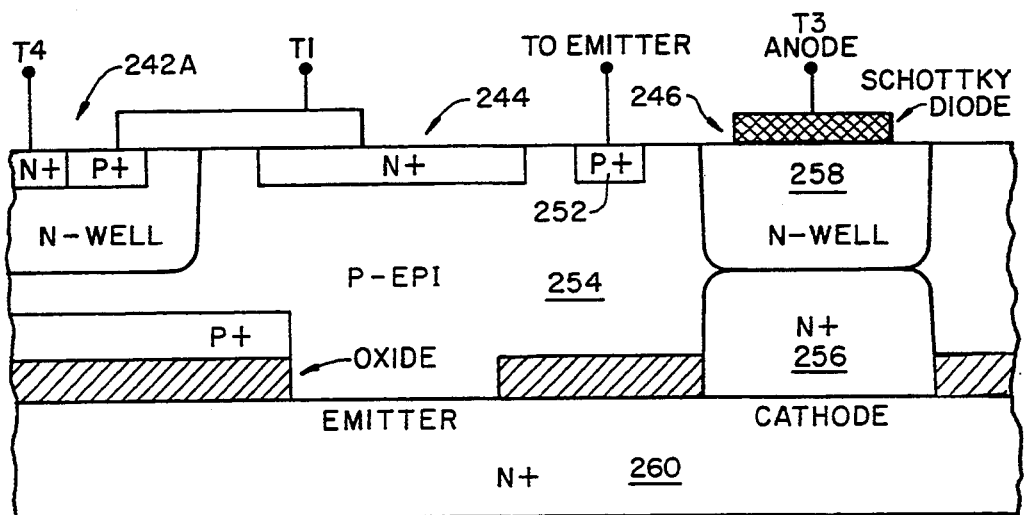
FIG. 10A
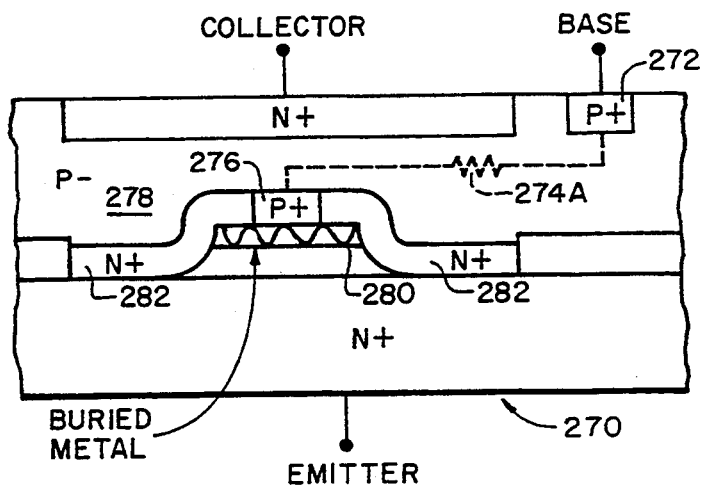
FIG. 11
FIG. 11A

INVERTED EPITAXIAL PROCESS SEMICONDUCTOR DEVICES

This application is a continuation of application Ser. No. 07/963,946, filed Oct. 20, 1992, abandoned, which is a continuation of application Ser. No. 07/649,125, filed Jan. 28, 1991, abandoned, which is a continuation of application Ser. No. 07/295,050, filed Jan. 6, 1989, abandoned.

FIELD OF THE INVENTION

The present invention relates to semiconductor devices and, more particularly, to vertical bipolar transistors and other high-voltage and/or high current devices having low resistance buried layers.

BACKGROUND OF THE INVENTION

Typical vertical bipolar transistors exhibit greater current gain in a direction downward from the top surface of the semiconductor into the bulk of the semiconductor, than the current gain in a direction upward from the bulk of the semiconductor to the surface. This asymmetry in vertical current gain is related to the ratio of the injected current collected by the collector region to the injected current recombined in the base region and which does not reach the collector.

One reason for this asymmetry in current gain arises from the area difference or ratio of the top junction area to the bottom junction area. Since the top surface of a typical vertical bipolar device must contain both the emitter and base contacts, the emitter area must necessarily be smaller than the collector area, which may fully occupy the opposite surface, in order to accommodate the base contact. As illustrated in FIGS. 1A and 1B, a greater number of carriers 54 injected by an emitter 52 disposed on a surface which includes the base 58, are collected than are collected when injected (60) by a region 56 occupying the entire surface. As illustrated in FIG. 1A, when the top emitter 52 is injecting carriers 54, the collection of the injected carriers by the collector 56 is relatively unaffected by the base regions 58. By contrast, when the carriers 60, 62 are injected by the collector 56 whose area is not diminished by other semiconductor regions, only those carriers 60 which are injected under the emitter 52 are collected by the emitter 52. The carriers 62 which are injected under the base 58 are recombined in the base 58, adding to the base current and thus lowering the current gain of the transistor 50. If the base 58 contacts are made as small as possible to minimize this effect, the base resistance increases, thus reducing other transistor performance characteristics.

A second reason for asymmetry in current gain arises from the difference in the doping of the top emitter and the underlying collector. The doping of the collector and emitter and the relative doping differential between adjacent N and P regions affects the ability of the emitter and collector to inject carriers. While the top-disposed emitter may be doped to the solid solubility limit of silicon by solid state diffusion, typically in the order of $10^{21}$ cm$^{-3}$, the doping of the collector is limited to a lower concentration, typically $10^{19}$ cm$^{-3}$ by the crystal growth process. The diffusion of dopant is graphically illustrated in FIG. 2 wherein the emitter region 52A is more highly doped than the collector region 56A. Process steps which enhance the concentration of dopant in the collector by solid state diffusion are diminished in subsequent process steps. The dopant concentration gradient is further degraded through sublimation, also known as "autodoping," during epitaxial growth of the lightly doped region. As a result, the concentration of dopant in the emitter 52 is typically several orders of magnitude higher than the collector, further contributing to the asymmetrical current gain of the vertical transistor.

SUMMARY OF THE INVENTION

A semiconductor device according to the present invention exhibits significantly reduced current gain asymmetry by substantially reducing the difference between the collector area and the emitter area, and by simultaneously providing more uniform concentration of emitter and collector doping. The resulting device exhibits enhanced vertical current gain symmetry and is embodied in a structure which permits high operating voltage and current without reduction in the effective base resistance. Preferably, the device of this invention is fabricated by the process disclosed in copending application of the assignee hereof, entitled INVERTED EPITAXIAL PROCESS, U.S. patent application Ser. No. 07/295,045 filed Jan. 6, 1989, now U.S. Pat. No. 5,004,705, incorporated herein by reference.

Semiconductor devices fabricated according to the invention include specifically disposed metallized or doped regions within the body of the semiconductor to provide significantly increased freedom in the fabrication of particular devices. Thus, the present invention contemplates unique structures within the semiconductor body and disposed at selected distances from the outer surfaces thereof.

The semiconductor regions, junctions and/or layers disposed within the body of the finished device include at least two semiconductor substrates which have been individually processed to form layers, regions, recesses, and other intended structures which are then bonded to form the unique internal semiconductor regions. The subsequent semiconductor processing of the outward surfaces of the bonded assembly provides the finished semiconductor device.

DESCRIPTION OF THE DRAWING

The invention will be more fully understood by reading the following detailed description taken together with the drawing, wherein:

FIG. 10 is a schematic diagram of a multiple transistor and diode circuit useful in power supply circuits;

FIG. 10A is a cross section of a semiconductor according to a further/alternate embodiment of the present invention implementing the circuit of FIG. 10;

FIG. 11 is a cross section of a semiconductor according to a further alternate embodiment of the present invention providing an internal base-emitter resistance;

FIG. 11A is a schematic representation of the semiconductor embodiment of FIG. 11;

DETAILED DESCRIPTION OF THE INVENTION

Figure 1A:
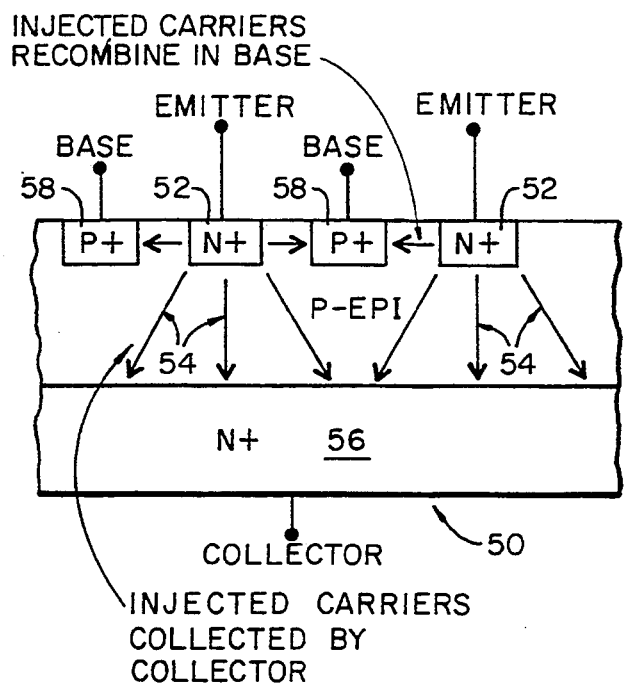
FIGS. 1A and 1B are cross-sectional views of a prior art structure illustrating the carriers injected by an emitter and a collector, respectively.
Figure 1B:
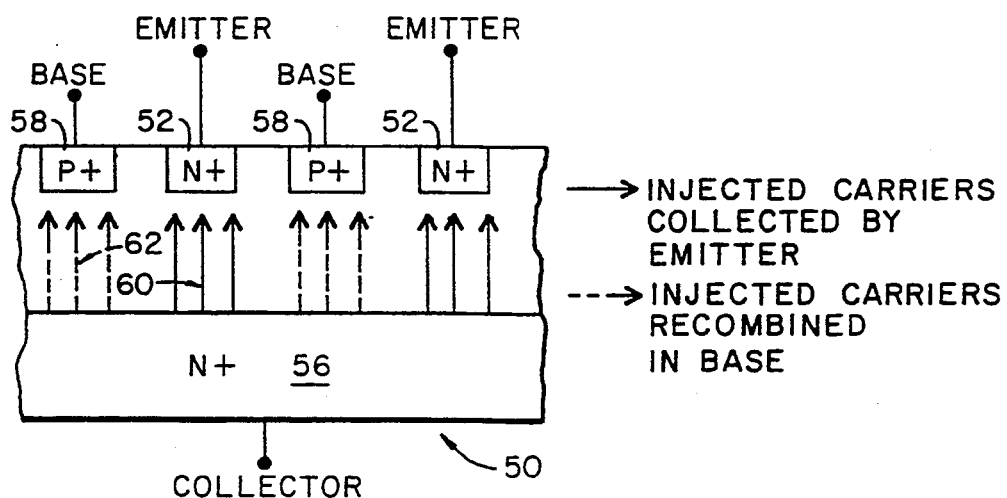
Figure 2:
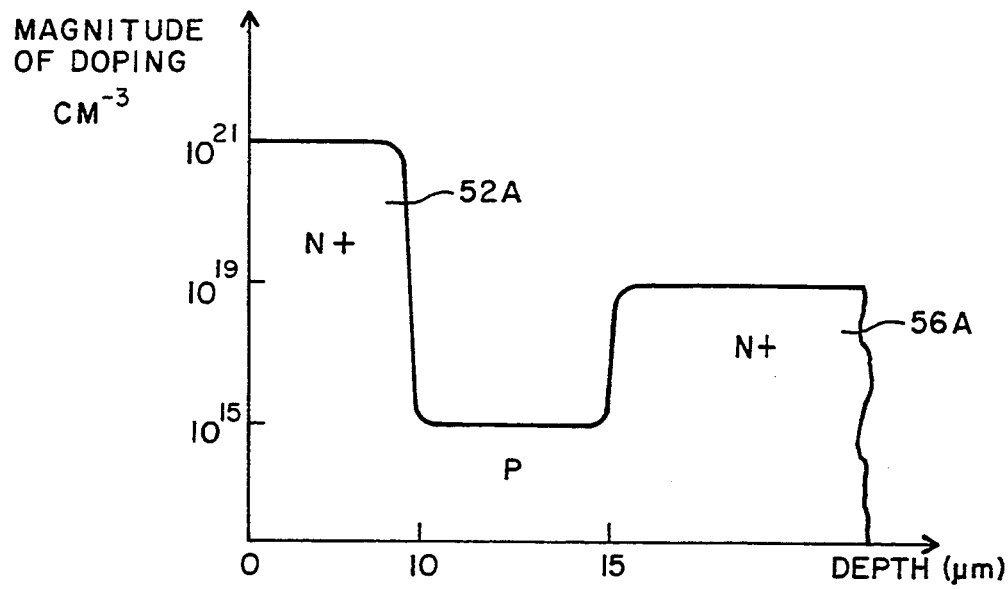
FIG. 2 is a graph showing typical prior art semiconductor doping versus distance into the substrate.
Figure 3A:
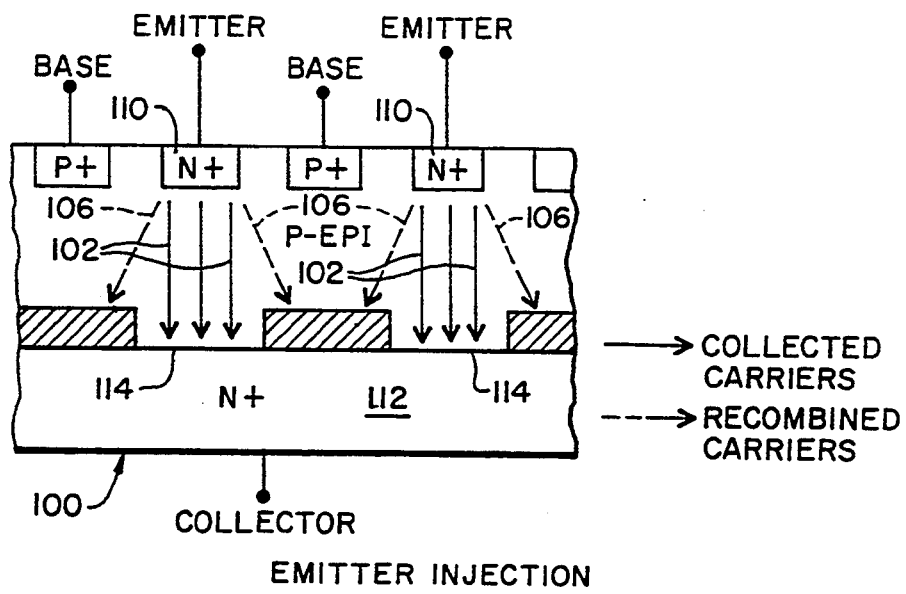
FIGS. 3A and 3B are cross sections of a semiconductor according to one embodiment of the present invention, illustrating emitter injection and collector injection, respectively.
Figure 3B:
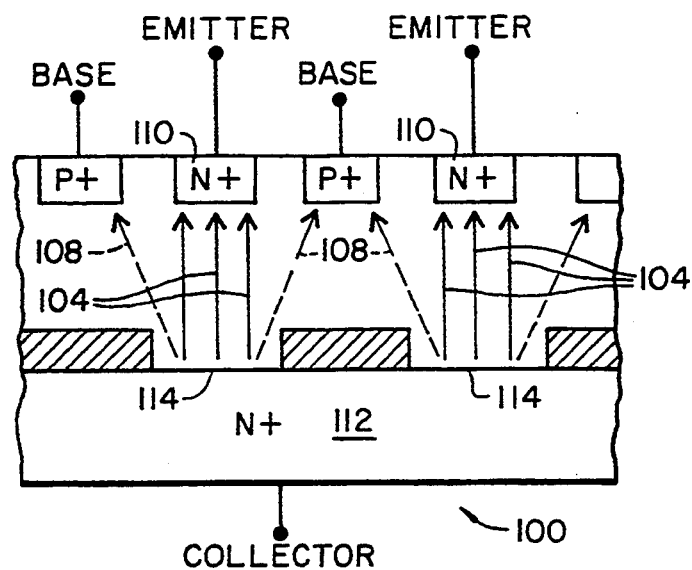

Referring to FIGS. 3A and 3B, a cross section of an epitaxial base bipolar transistor 100 is shown. The cross-sectional area of the emitter 110 is approximately equal to the confronting portion 114 of collector 112. The paths of injected carriers 102 and 106 for emitter injection, and collector injected carriers 104 and 108 for injection are illustrated respectively in FIGS. 3A and 3B. According to the invention, only the carriers following paths 102 and 104 will be received in the opposing collector and emitter regions 114 and 110, respectively. The carriers traveling along paths 106 and 108 do not reach the active collecting regions on the respective opposing surfaces.

Figure 4:
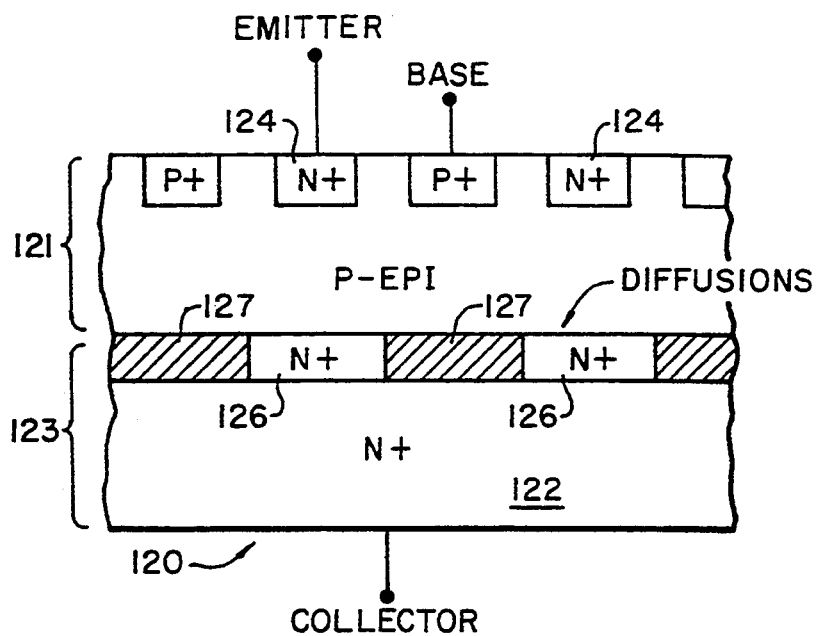
FIG. 4 is a cross section of a semiconductor according to an alternative embodiment the present invention.

Referring to FIG. 4, the structure 120 reduces the current gain asymmetry by providing a more uniformly doped collector 126 and emitter 124 region. The diffused collector region 126 can be formed on wafer 121 or on wafer 123 prior to bonding of wafer 121 and wafer 123 according to the aforesaid copending application, UNI-049XX. The formation of the collector region 126 is provided by both a solid state diffusion process to heavily dope the region and a patterning process to create the apertured collector regions 126. The regions 127 between the collector regions 126 comprise insulating materials, such as air or silicon dioxide. The emitter region 124 is also formed by a solid state diffusion process which allows a dopant profile identical to the collector region 126. The region 122 provides a mechanical support and electrical contact to region 126. Moreover, as discussed above, diffused N+ regions 126 can provide an area substantially equal to the area of the confronting emitter region 124. Thus, according to the present invention, either the region 124 or region 126 can function successfully as the emitter, and the other regions (126 or 124) can function as the collector.

Figure 5:
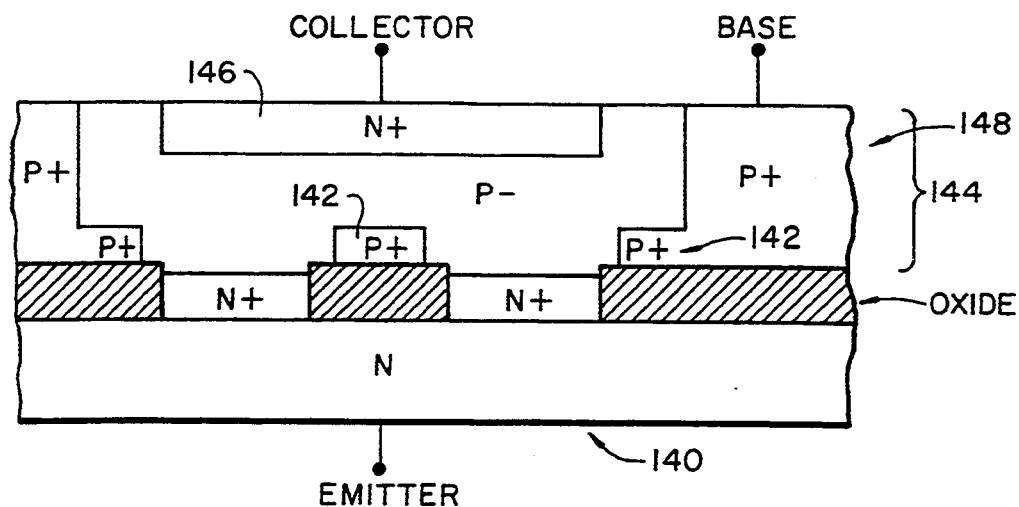
FIG. 5 is a cross section of a semiconductor according to a further alternate embodiment of the present invention.

A high upward current gain, low downward current gain bipolar transistor structure 140, according to the present invention, shown in FIG. 5, includes the base contact diffusions 142 disposed near the bottom of the wafer 144 and providing the collector 146 at the top of the wafer. The P+ contact grid 148 provides base interconnection at the edge of the semiconductor (and/or in cells of a selected pattern) to provide an overall uniform and minimized base resistance. Furthermore, the buried base grid contact 142 can further include a buried metal region, similar to that in FIG. 11, FIG. 21 or as shown in related application UNI-049XX, to further reduce the resistance of base region 142.

Figure 6:
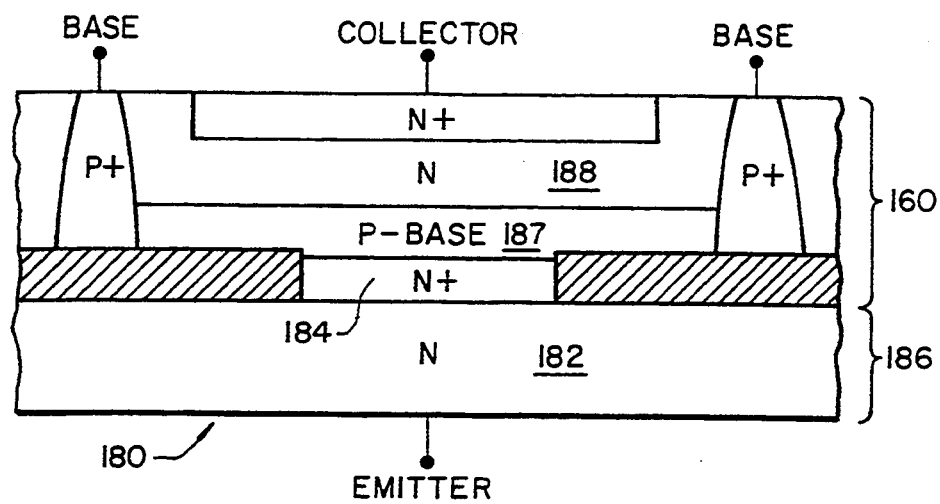
FIG. 6 is a cross section of a semiconductor according to a further embodiment of the present invention.

An alternate embodiment of a semiconductor 180 providing a higher breakdown voltage is shown in FIG. 6 and which provides a lightly doped collector 188 which results in a lower downward current gain. The semiconductor 180 is formed by a process having a sequence of steps occurring in an inverse sequence of the conventional double diffused bipolar process. The emitter 184 and base 187 are formed into wafer 160 prior to bonding to wafer 186. The emitter 184 is formed in an aperture to allow high upward current gain. Wafer 186 provides a mechanical support and ohmic contact to emitter region 182. Thus, the structure of FIG. 6 is the true complement to the devices formed according to conventional bipolar processes, and allows high voltage and high upward current gain capability.

Figure 7:
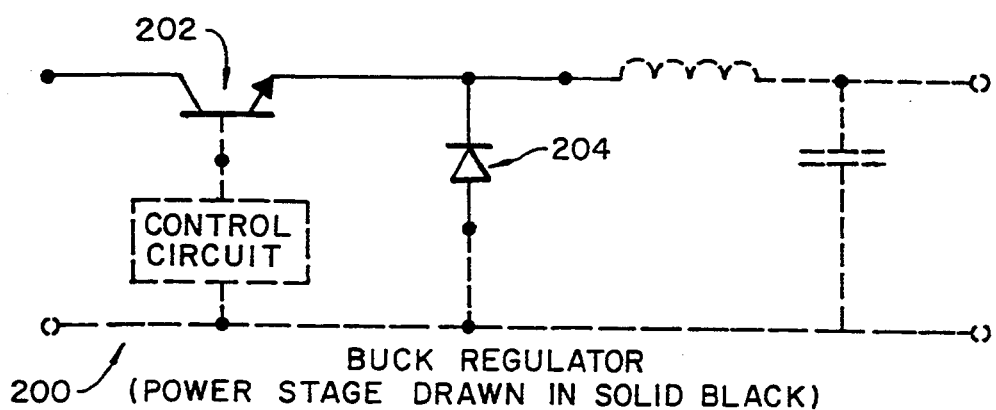
FIG. 7 is a schematic diagram including a power transistor and related diode/useful in power supply circuits.
Figure 8:
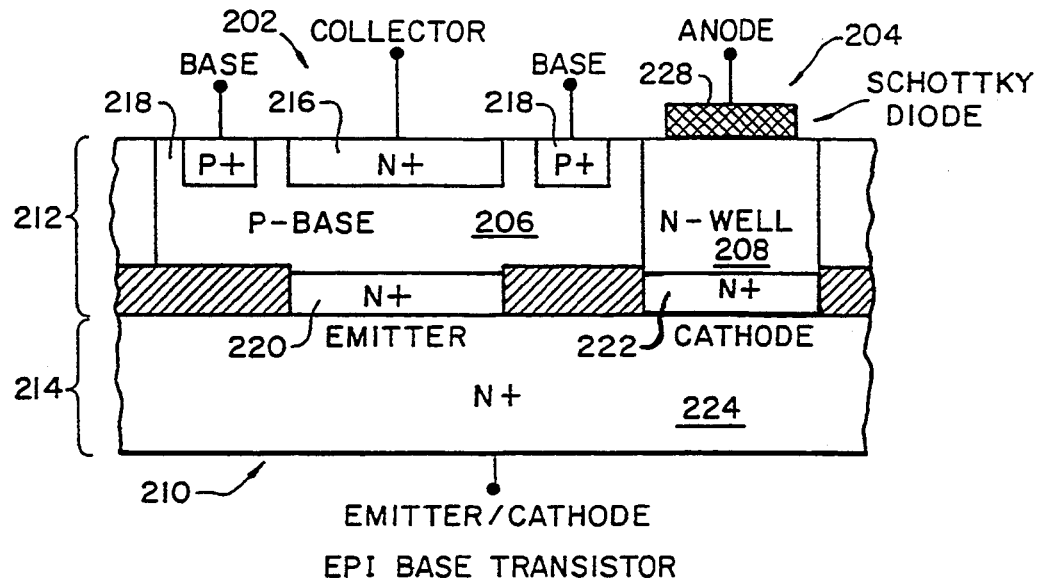
FIG. 8 shows a cross section of a semiconductor according to a further alternate embodiment of the present invention providing the power semiconductor and diode of FIG. 7 in a single substrate.

A schematic diagram 200 of a switching power supply buck type regulator is illustrated in FIG. 7. The transistor 202 and diode 204 are fabricated in a single integrated circuit according to an alternative embodiment of the invention illustrated in cross section in FIG. 8. The transistor 202 comprises a bipolar transistor and the diode 204 comprises a Schottky diode. The cathode of the diode 204 is connected to the emitter of the transistor 202 fabricated as per FIG. 4. As shown in FIG. 8, the transistor 202 is disposed laterally adjacent to the diode 204 in the structure 210. Such a structure would only be possible with an inverted transistor. The structure 210 comprises a first wafer 212 bonded to a second wafer 214, wherein the collector, base, emitter and cathode regions 216, 218, 220 and 222, respectively, are formed by a diffusion process. Although a single diode 204 and vertical transistor 202 is shown in the structure 210 of FIG. 8, a plurality of diodes and/or transistors may be provided in a cellular or interdigitated manner (not shown) to provide higher current control or other desirable features. The active regions of the semiconductor devices may then be connected by surface conductors or internally disposed resistive or conductive material. In the structure 210 of FIG. 8, a common emitter/cathode terminal is provided by the common N+ region 224 connected to the emitter and cathode regions 220 and 222. The P− base region 206 and the N− well 208 of the Schottky diode 204 are provided by standard techniques.

Figure 9:
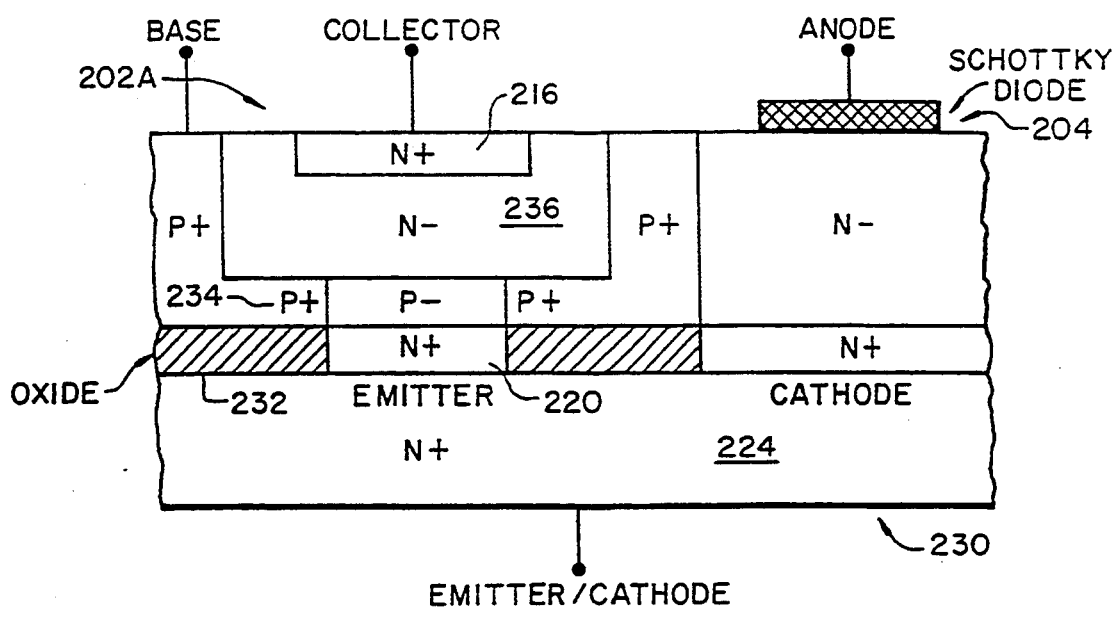
FIG. 9 is a cross section of a semiconductor according to a further alternate embodiment of the present invention.

A higher voltage double-diffused structure 230 embodiment of the present invention is shown in FIG. 9 having similar Schottky diode structure to that of FIG. 8. The collector 216 is spaced apart from the base region 234 by an N− region 236 to provide the desired high breakdown voltage characteristic. In both FIG. 8 and FIG. 9 the Schottky diode could be replaced with a P/N junction.

A three transistor circuit useful in a switching power supply is shown in the schematic 240 of FIG. 10 which provides a further alternative embodiment 250 of the present invention shown in FIG. 10A including the two transistors 242 and 244 as well as the diode 246 and resistor 248. According to the present invention, the transistor 242 is implemented as a vertical transistor in the structure 250, providing better frequency response and higher gain than the conventional lateral implementation. The depth of the N well region 258 of the Schottky diode 246 is reduced by providing a separate N+ diffusion region 256 which further lowers the on resistance of the diode 246. The resistor 248 of FIG. 10 is implemented with a P+ region 252 diffused in the P epi substrate 254 and externally connected to the emitter and cathode terminal 262 which is connected to the N+ region 260 and in turn connected to the N+ diffusion region 256, forming the cathode region of the Schottky diode 246.

In a further alternative embodiment shown as a structure 270 of FIG. 11, shown in cross section, includes an internal base emitter resistance 274 as illustrated in the schematic representation 275 of FIG. 11A and requires no external connections. The base emitter resistance 274 is contacted at the emitter 282 by a small P+ diffusion region 276 which permits the distributed resistance 274A of the P− substrate 278 to be shorted to the emitter by a buried metal (or other low resistive material) 280 provided according to the process of copending application UNI-049XX, incorporated by reference. Thus the structure 270 does not the need external connections to provide a selected base emitter resistor 274.

Figure 12:
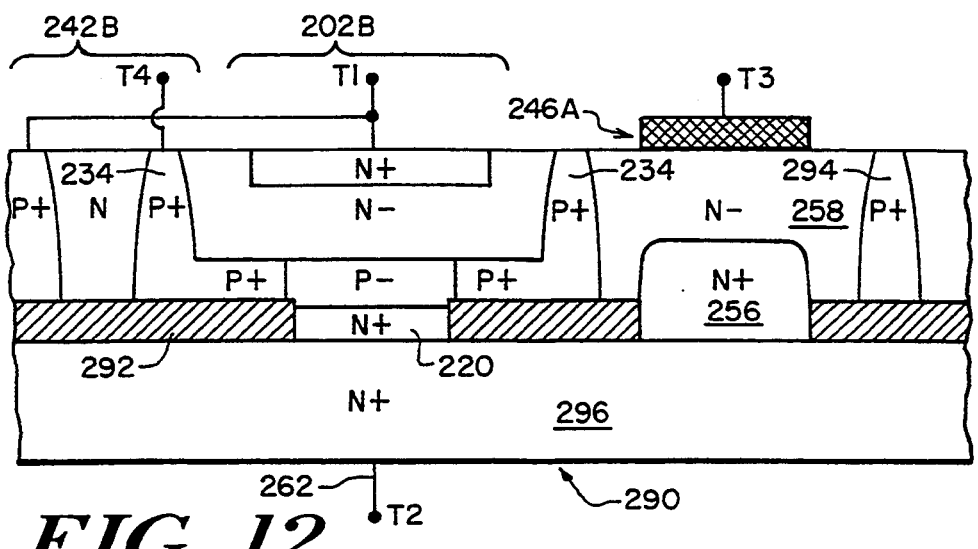
FIG. 12 is a cross section of a semiconductor device according to a further alternative embodiment of the present invention.

A cross section of the two-transistor circuit shown in FIG. 10 is structure 290 according to the present invention and is shown in FIG. 12 which includes a lateral PNP transistor 242B. Since the structure 290, according to the present invention includes an oxide insulating layer 292 and deeply diffused P collector and emitter and N base regions, substrate injection is avoided and the PNP device 242B exhibits the favorable vertical transistor characteristics of the previously described novel semiconductor devices. The NPN transistor 202B is structurally and functionally similar to the transistor 202A of structure 230 of FIG. 9. The Schottky diode 246A of FIG. 12 is substantially the same structure as provided in structure 250 of FIG. 10A. A P+ isolation region 294 is provided. The emitter of transistor 202B and cathode of diode 246A in FIG. 12 is connected to a common N+ region 296 having a common emitter cathode contact 262.

Figure 13:
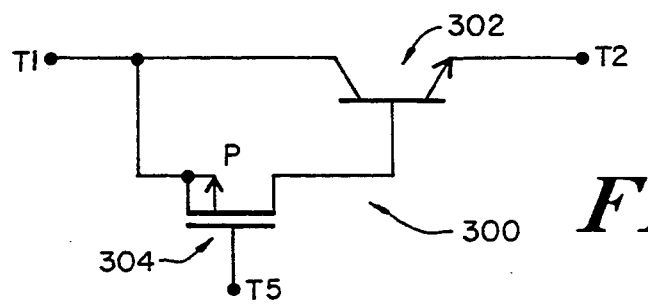
FIG. 13 a schematic representation of a circuit including field effect transistors, bipolar transistors and a diode useful in power supply circuits.
Figure 14:
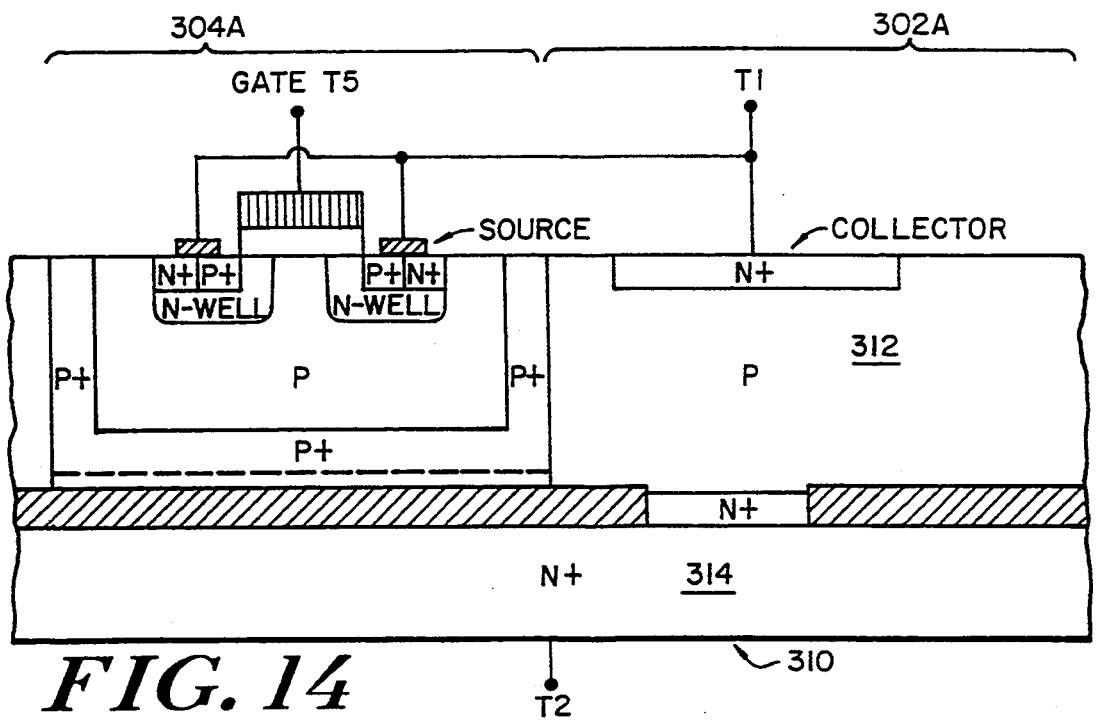
FIG. 14 is a cross section of a semiconductor device according to a further alternative embodiment of the present invention showing partial implementation of the circuit of FIG. 13.

A structure for fabricating a metal oxide semiconductor field effect transistor, MOSFET, driven bipolar transistor is shown in FIG. 13. In this structure, P-channel MOSFET 304 acts as a high input impedance drive for bipolar transistor 302. To be effective, transistor 304 has at least the same breakdown voltage as transistor 302 and has an on-resistance sufficient to supply 3–10% of the transistor 302 collector current as transistor 302 base current. Both devices would be most optimally fabricated as vertical devices. This implementation 310 is shown in FIG. 14, the PMOS device is 304A and the bipolar device is 302A. Region 312 acts as both the drain of the MOSFET and the base of the bipolar transistor. The substrate 314 acts as the emitter of the bipolar transistor.

Figure 15:
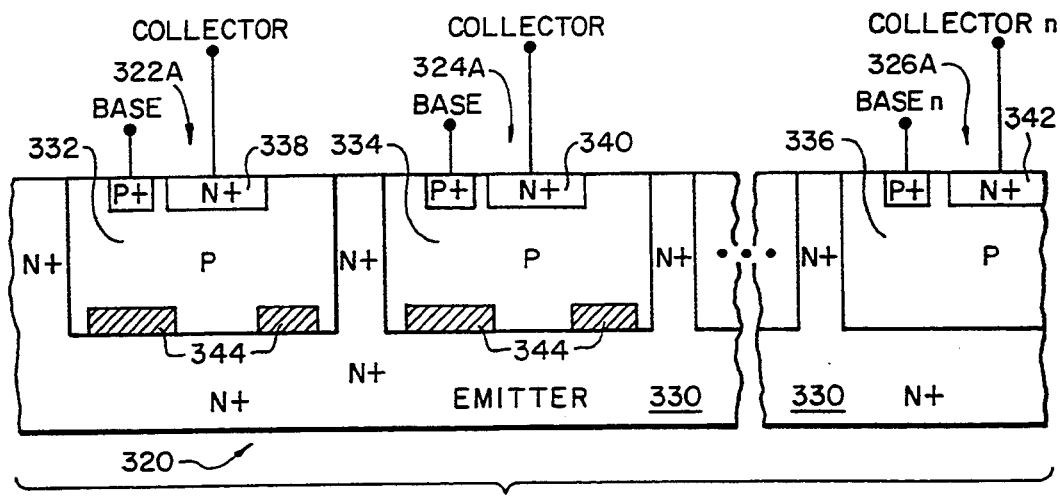
FIG. 15 is a cross section of a semiconductor according to a further alternative embodiment of the present invention including plural power transistors having a common emitter.
Figure 15A:
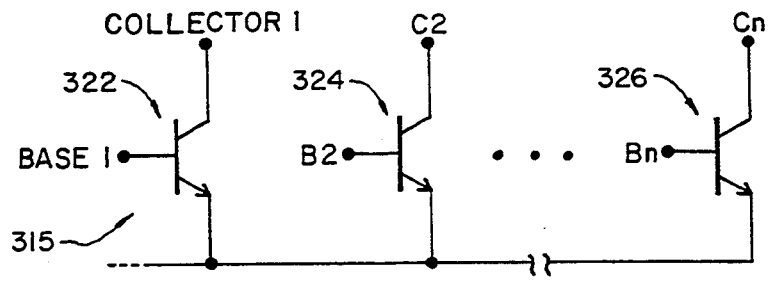
FIG. 15A is a schematic representation of the semiconductor device illustrated in FIG. 15.

A semiconductor device 320, shown in FIG. 15, comprising multiple power transistors 322, 324 and 326, illustrated in the schematic diagram 315 of FIG. 15A, share a common emitter region 330 according to an alternative structure of the present invention. Epitaxially formed base regions 332, 334 and 336 are included in the structure 320 of FIG. 15 which also includes collector regions 338, 340 and 342. Aperture regions 344 are provided to enhance the gain symmetry of the transistors 322A, 324A . . . 326A according to the embodiments discussed above.

Figure 16:
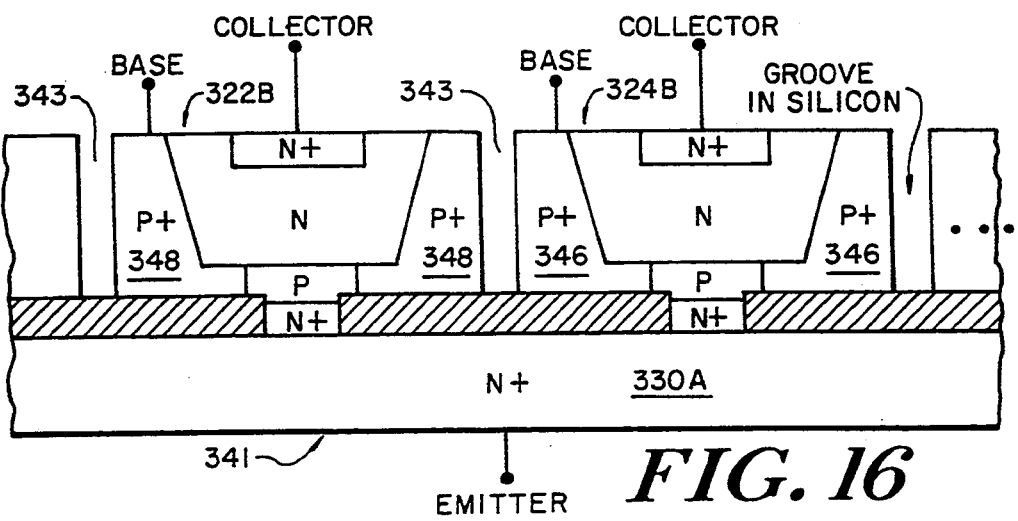
FIG. 16 is a cross section of a semiconductor according to a further alternative embodiment of the present invention providing series connected transistors.

Referring to FIG. 15A, the structure 341 of FIG. 16 includes cuts 343 to provide further isolation of the transistors 322B and 324B for higher voltage applications. The transistors 322B and 324B includes double diffused base regions 348 and 346 to provide a lightly doped collector vertical transistor structure having a common emitter region 330A. The fabrications and structures of the present invention, particularly the alternative 341 shown in FIG. 16, is compatible with the fabrication and structure of integrated injection logic (IIL), not shown. According to a further embodiment of the present invention, the power structures and associated logic (not shown) may be combined in a single manufactured integrated circuit.

Figure 17:
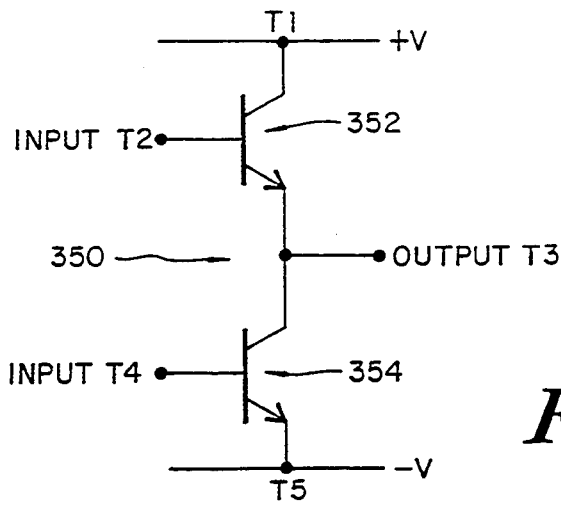
FIG. 17 is a schematic representation of a semiconductor in FIG. 16 illustrating a totem pole circuit.
Figure 18:
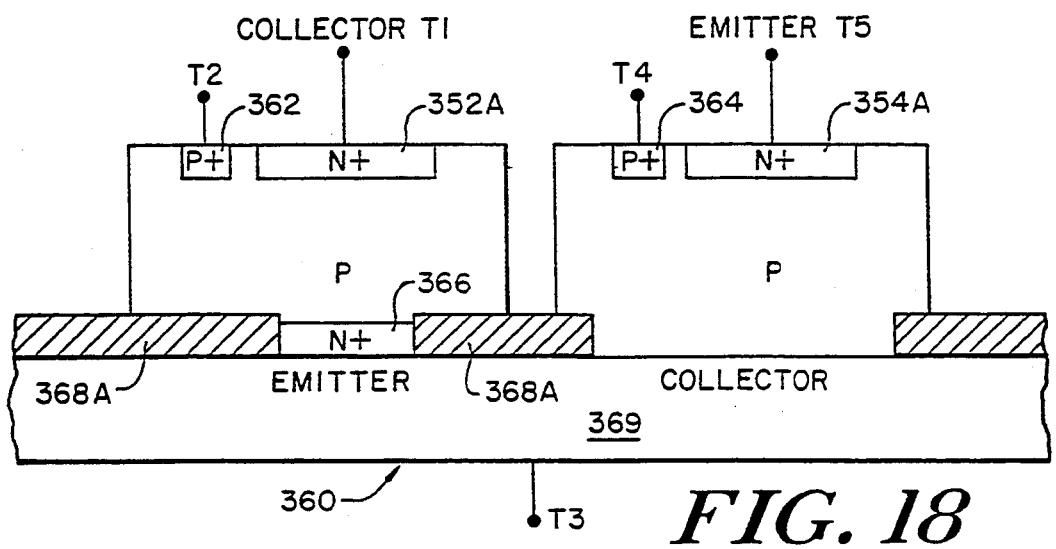
FIG. 18 is a cross section of a semiconductor device according to a further alternative embodiment of the present invention providing series connected transistors.

Another circuit topology commonly used in power applications is a totem pole circuit 350, illustrated schematically in FIG. 17, where a first transistor 352 and a second transistor 354 are series connected across a power supply, and are alternately made conductive and providing an output signal from a common transistor connection. A single structure 360 illustrated in cross section in FIG. 18 provides implementation 352A and 354A of the transistors shown in FIG. 17. Although epitaxial base regions 362 and 364 are shown, double diffused base regions as illustrated in the structure 202A of FIG. 9 may be provided. The N+ emitter region 366 is provided in an oxide layer 368A aperture to provide improved vertical current gain in transistor 352A. The emitter diffusion 366 is disposed on an N+ region 369 which also forms the collector of transistor 354A. A further alternative to the structure 360 includes a plurality of similar structures disposed in a matrix or cellular manner (not shown) having the respectively active regions parallel connected.

A further alternative embodiment of the structure 360 of FIG. 18 includes a vertical power MOS field effect transistor in place of one of the bipolar transistors, such as transistor 354A. An exemplary illustration of a vertical power MOS field effect transistor is provided by reference to field effect transistor 304A of FIG. 14. Furthermore, although NPN transistors are shown in the schematic 350, two PNP and a pair of complementary NPN/PNP transistors may be included.

Figure 19:
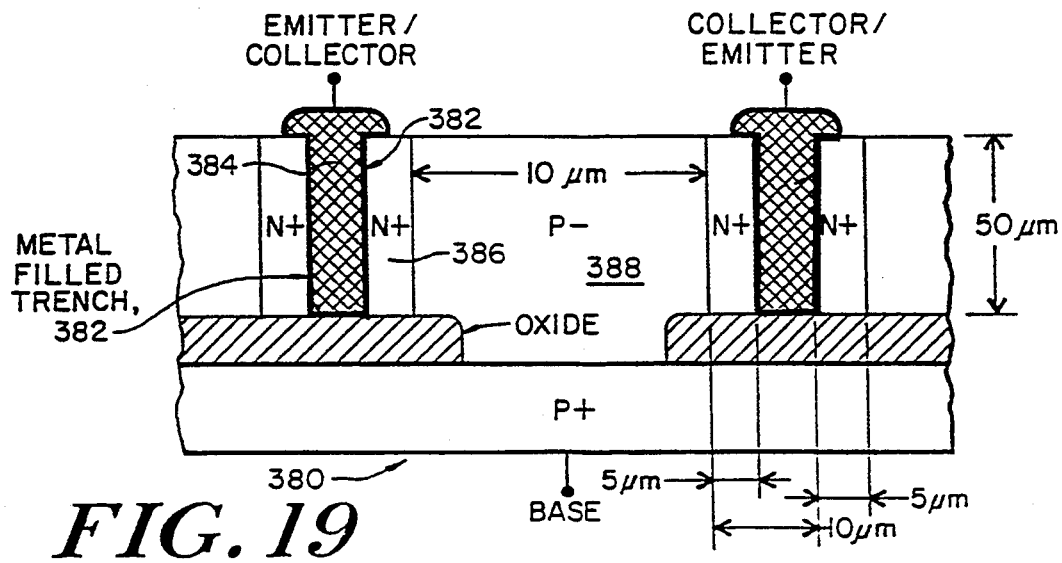
FIG. 19 is a cross section of a semiconductor device according to a further alternative embodiment of the present invention.

A further alternative embodiment of the present invention shown in cross section 380 provides lateral semiconductor devices having the superior characteristics achieved with the above discussed vertical semiconductors. A structure 380 includes vertical trenches 382 which are doped with an N+ dopant in region 386. The trenches 302 are then filled with a metal 384, typically by metal deposition, to a thickness which will fill the trench 382. The area of the emitter 386 of the embodiment shown in FIG. 19 is approximately 1.7 times the emitter area of a similar vertical device. For the same electrical characteristics this means that this device would be 1.7 times smaller than a similar vertical device.

In a further alternate embodiment (not shown), the relative area advantage may be increased to 2.5 by reducing the width of the base 388 to 5 microns and reducing the metal 384 thickness to 5 microns, thus providing a semiconductor structure which has a smaller area thereby permitting mounting in standard packages (not shown) previously not available to high powered transistors of the 50 amp class in which the embodiment may be placed.

Figure 20:
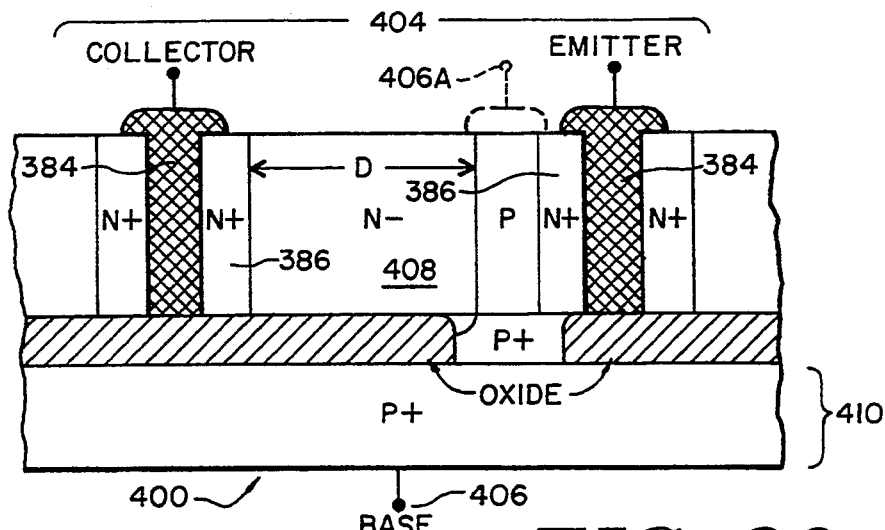
FIG. 20 is a cross section of a semiconductor embodiment according to a further alternative embodiment of the present invention.

A further alternate embodiment of the present invention provides a higher voltage double diffused implementation 400 (of the structure 380) shown in FIG. 20. An N− region 408 is included, whose dimension D effectively determines the breakdown voltage and the resulting area of the semiconductor device 404. For example, a 50 micron dimension D of region 408, and other regions of similar structure and dimension to the embodiment 380 of FIG. 19 provides a VB(CB0) of approximately 600 volts.

In a further alternative embodiment of the structure 400 in FIG. 20, the base contact 406 may be disposed on the top 406A of the semiconductor 404. In that embodiment, the P+ wafer 410 would include an oxide layer on which the top wafer including transistor 404 is bonded. Moreover, a diode, such as illustrated in the previous structures of FIGS. 8-12 may be implemented adjacent to the transistor 404 and insulated from the substrate 410 to provide a dielectrically isolated semiconductor power stage for the circuit 200 of FIG. 7.

Figure 21:
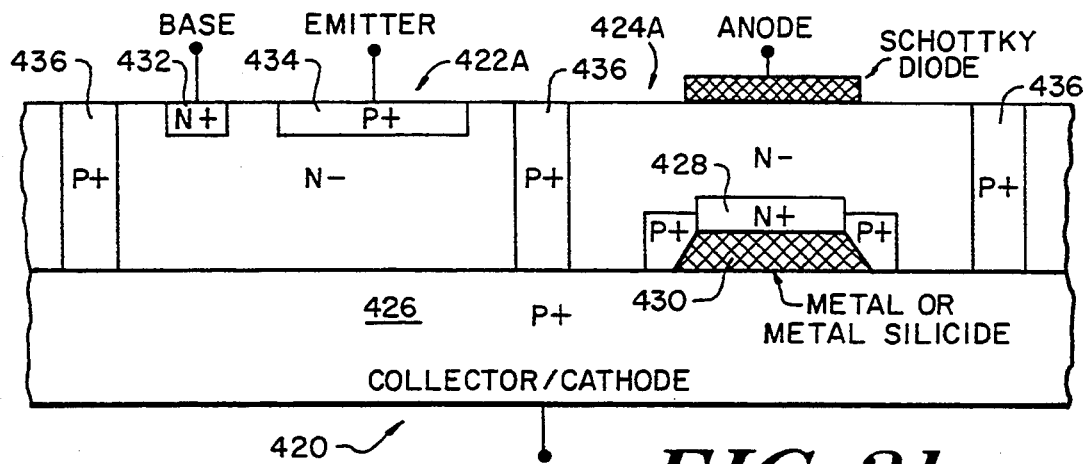
FIG. 21 is a cross section of a semiconductor embodiment according to a further alternative embodiment of the present invention.
Figure 21A:
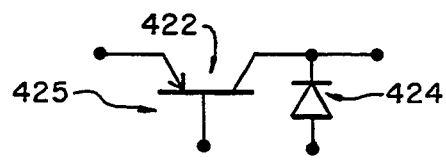
FIG. 21A is a schematic representation of the semiconductor illustrated in FIG. 21.

Internal metal or metal silicide connection of the active regions is illustrated in a further embodiment 420 shown in FIG. 21 to provide the circuit topology 425 as illustrated in FIG. 21A. The collector region 426 of the PNP transistor 422A is internally connected to the cathode contact 428 of the Schottky diode 424A by a metal or metal silicide material 430 provided before bonding of the two wafers (as taught in copending application UNI-049XX, incorporated by reference). The base and emitter regions 432 and 434 of transistor 422A as implemented according to the teaching of similar structures discussed above and may be replaced by alternative base structures as previously illustrated. P+ isolations regions 436 are provided.

Figure 22:
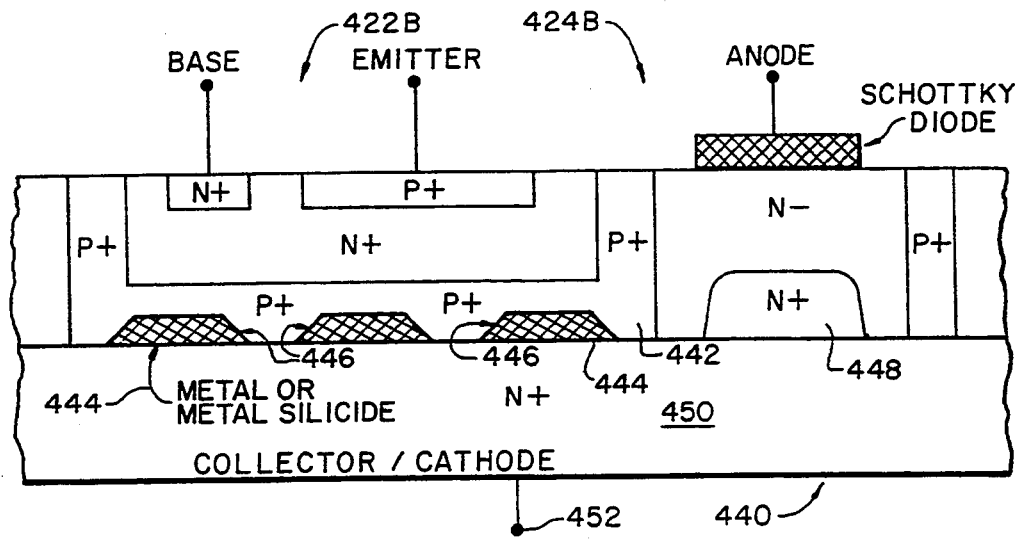
FIG. 22 is a cross section of a semiconductor according to a further alternative embodiment of the present invention.

A cross section 440 of a structure providing an enhanced performance of the embodiment illustrated by the structure 420 is shown in FIG. 22. The collector 442 resistivity of the PNP transistor 422B is improved by providing metal or metal silicide 444 in recesses 446, which provide internal shorting resulting in reduced collector resistance and eliminates carrier injection in the diode 424B. In the structure 440, the metal or metal silicide material 444 PNP transistor collector 442 and Schottky diode cathode 448 are connected to an N+ region 450 to which a common collector/cathode connection 452 is made.

Figure 23:
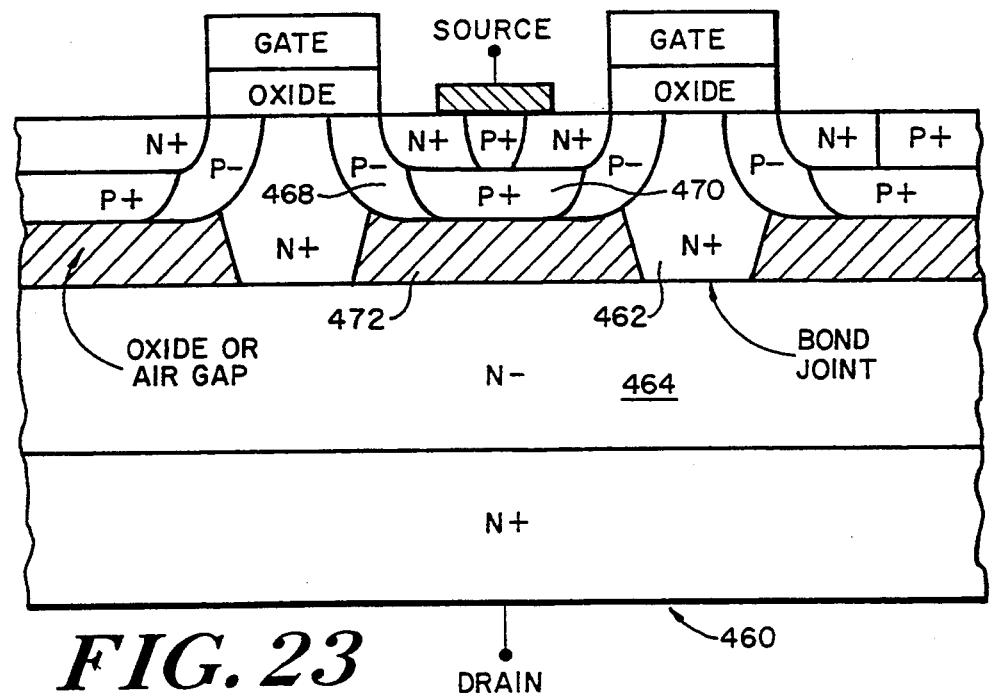
FIG. 23 is a cross section of a semiconductor according to a further alternative embodiment of the present invention providing a field effect transistor.

A further embodiment of the present invention shown in cross section 460 in FIG. 23 shows an exemplary low output capacitance MOS field effect transistor. The main component of output capacitance in a vertical MOSFET is the capacitance between the P-type regions 468 and 470 and the N− region 464. To reduce this capacitance, a gap or void 472 is introduced between regions 468 and 470 and region 464. This gap 472 can be filled with material of the appropriate dielectric coefficient, such as air, silicon dioxide, or both. The gap or void 472 also allows the N− regions 462 and 464 to be more heavily doped thus reducing on-resistance without increasing capacitance. In one embodiment, the voids are created prior to bonding the wafers together. Thus, the structure 460 has reduced AC and DC losses.

Figure 24:
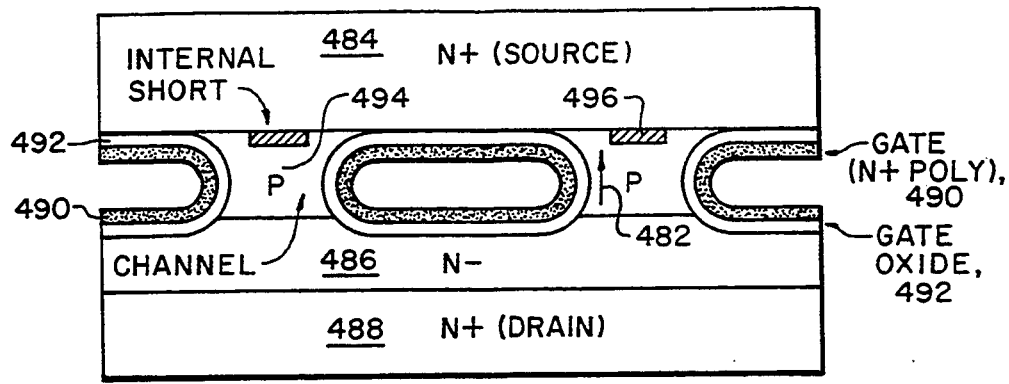
FIG. 24 is a cross section of a semiconductor according to a further alternative embodiment of the present invention.

A further alternate embodiment of the present invention 480 is shown in cross section in FIG. 24 which provides a low on resistance MOS field effect transistor structure. This structure 480 uses vertical channels 482 formed in P-type region 494 by the gate 490 in conjunction with gate oxide 492. The source 484 is ohmically connected to region 494 through the internal short 496. The drain consists of region 486 and 488. This device provides low on-resistance because it allows for an increase in the channel length per unit area over the conventional horizontal channel structure. Its large source and drain areas also allow for novel packaging approaches.

Figure 25:
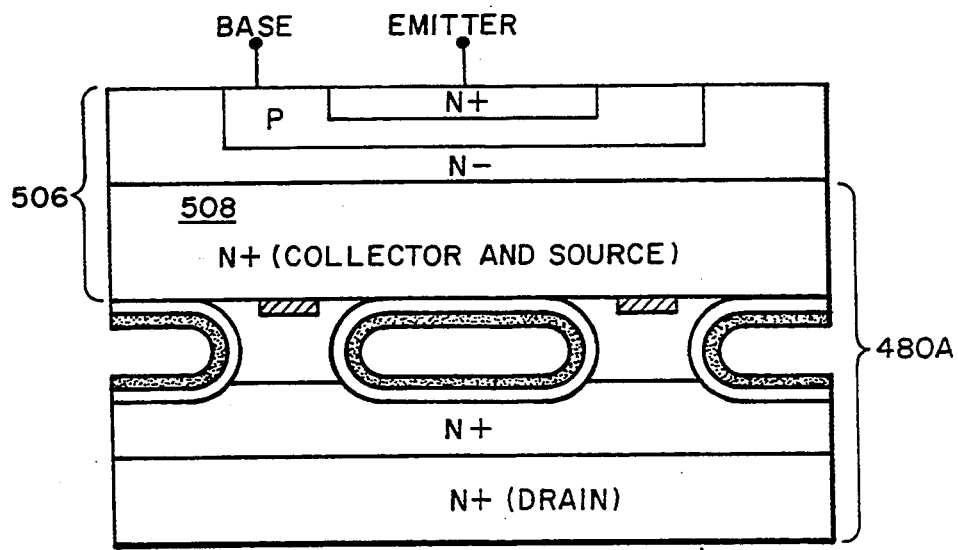
FIG. 25 is a cross section of a semiconductor according to a further alternative embodiment of the present invention providing a three-dimensional semiconductor device.
Figure 25A:
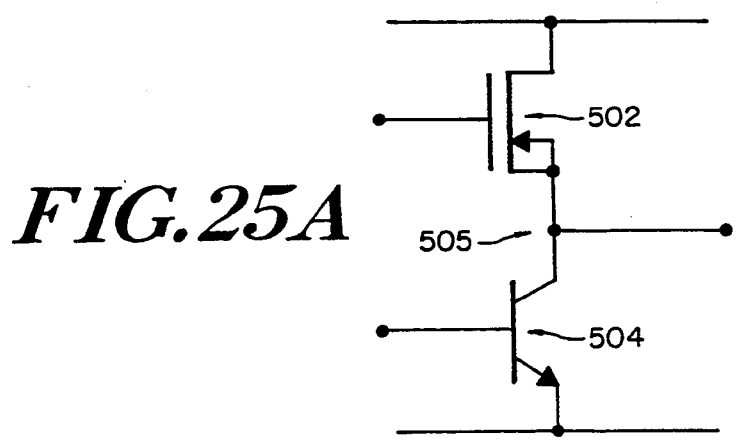
FIG. 25A is a schematic representation of the semiconductor illustrated in FIG. 25.

A further alternative embodiment of the present invention 500, shown in FIG. 25, provides a three-dimensional structure by bonding additional wafers to add layers and thus provide further semiconductors connected vertically. The circuit topology as illustrated in the schematic diagram 505 in FIG. 25A is implemented in structure 500 shown in cross section wherein the MOS field effect transistor 502 comprises the lower portion 480A of the structure 500 while the bipolar transistor 504 comprises the upper portion 506 having a common region 508 functioning as the collector of the bipolar transistor 504 and as the source of the MOS field effect transistor 502.

The vertical structure illustrated in FIG. 25 is not limited to the two transistors shown. Addition or alternative active and/or passive elements may be added according to the teaching of the examples shown above. Furthermore, the inclusion of metallic regions deposited in recesses formed before the wafers are bonded, such as illustrated in the above-discussed alternative embodiments, are within the scope of the present invention.

Figure 26:
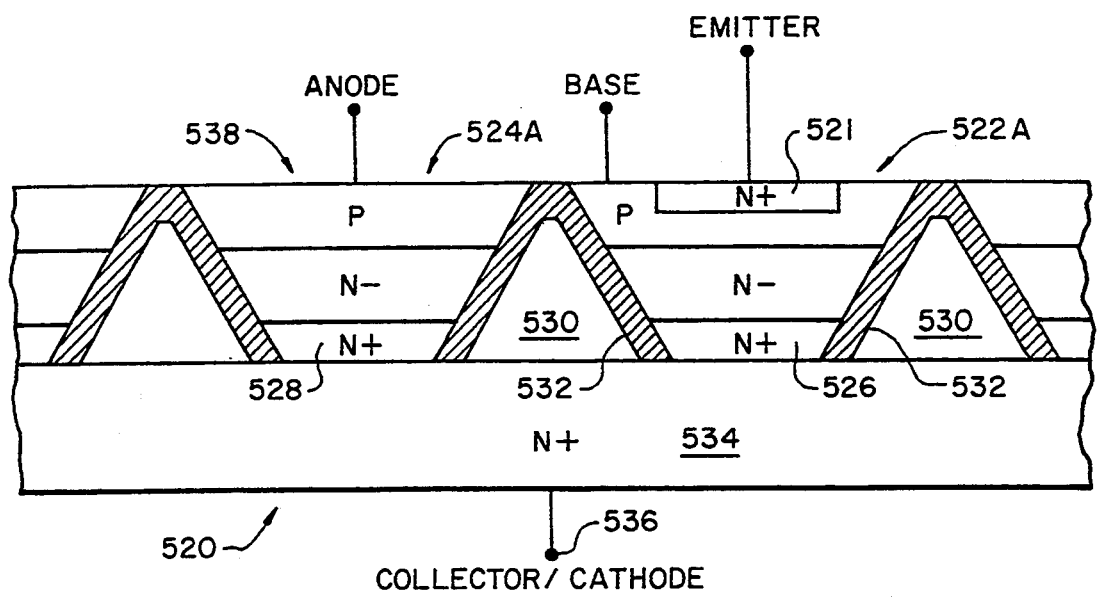
FIG. 26 is a cross section of a semiconductor according to a further embodiment of the present invention.
Figure 26A:
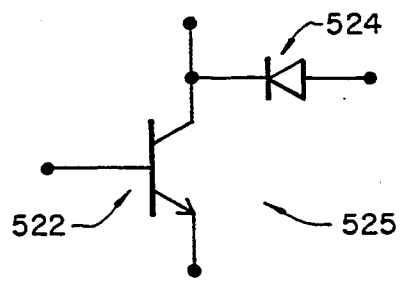
FIG. 26A is a schematic representation of the semiconductor illustrated in FIG. 26.

A further alternative embodiment 520 is shown in cross section in FIG. 26 to provide the circuit topology 525 shown in the schematic diagram 26A, providing a mesa bipolar transistor 522 in combination with an anti-parallel diode 524 on the same semiconductor die. In the collector 526 of transistor 522A, and anode 528 of diode 524 are formed with an N+ diffusion in a substrate having recesses 530 formed therein, including an oxide coating 532 formed according to the process in copending application UNI-049XX, incorporated by reference. As with the previously discussed exemplary embodiments, the upper wafer, including the N+ diffused regions 526 and 528, is bonded to a wafer having an N+ region 534 therein to which a common collector/cathode contact 536 is provided. Thus, the structure 520 shown in FIG. 26 provides a high breakdown voltage while maintaining a planar surface 538 on which interconnection for a grounded emitter 521 can be provided. Furthermore, control circuitry on dielectrically isolated islands (not shown but similar to each transistor 522A, 524A) can be added and connected to the devices shown in the embodiment 520 of FIG. 26.

Further embodiments provided by substitution and modification of the above structure made by those of skill in the art are considered to be within the scope of the present invention which is not to be limited except by the claims which follow.

What is claimed is:

1. A semiconductor structure in which at least one semiconductor device is disposed, said semiconductor structure comprising:
   a first semiconductor wafer having a first doped region of a first dopant forming a first active portion of said at least one semiconductor device; and
   a second semiconductor wafer bonded to said first semiconductor wafer at an interface and having a second doped region forming a second active portion of said at least one semiconductor device, wherein one of said first and second semiconductor wafers has a surface adjacent to said interface in which an insulating region is disposed and a non-insulating region is disposed, and wherein one of the first doped region of said first semiconductor wafer and the second doped region of said second semiconductor wafer is spaced from said interface.

2. A bonded semiconductor in which is formed at least one semiconductor device, said bonded semiconductor comprising:
   a first semiconductor wafer having a first doped region of a first dopant forming a first active portion of said at least one semiconductor device;
   a second semiconductor wafer bonded to said first semiconductor wafer at an interface and having a second doped region of said first dopant forming a second active portion of said at least one semiconductor device; and
   wherein one of said first and second semiconductor wafers has a surface adjacent to said interface with an aperture in which an insulating region is disposed, said one of said first and second semiconductor wafers having a non-insulated region disposed in a portion of said surface adjacent to said aperture to prevent current flow between said first doped region and said second doped region through said insulating region and to permit substantially symmetric current flow between said first and said second doped regions through said non-insulated region.

3. The semiconductor of claim 2 wherein said first and second semiconductor wafers includes single crystal semiconductor wafers.

4. The semiconductor of claim 3 wherein said first and second single crystal semiconductor wafers are selected from the group including silicon, gallium arsenide and germanium.

5. The semiconductor of claim 2 further including a third diffused region in said one of said first and second semiconductor wafers, said third diffused region forming a third active portion of said at least one semiconductor device.

6. The semiconductor of claim 5 wherein said active semiconductor portions include:
   an emitter region;
   a base region; and
   a collector region.

7. The semiconductor of claim 2 wherein said first and second active semiconductor portions comprises an anode region; and
   the other of said first and second active semiconductor portions comprises a cathode region.

* * * * *

UNITED STATES PATENT AND TRADEMARK OFFICE
CERTIFICATE OF CORRECTION

PATENT NO. : 5,416,354
DATED : May 16, 1995
INVENTOR(S) : Scott C. Blackstone

It is certified that error appears in the above-indentified patent and that said Letters Patent is hereby corrected as shown below:

Column 6, line 54, "doped collector vertical" should read --doped vertical--.

Signed and Sealed this

Eighteenth Day of June, 1996

Attest:

BRUCE LEHMAN

Attesting Officer     Commissioner of Patents and Trademarks